(12) United States Patent
Johnson

(10) Patent No.: US 7,188,277 B2
(45) Date of Patent: *Mar. 6, 2007

(54) INTEGRATED CIRCUIT

(75) Inventor: Tyler James Johnson, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 542 days.

This patent is subject to a terminal disclaimer.

(21) Appl. No.: 10/402,034

(22) Filed: Mar. 28, 2003

(65) Prior Publication Data

US 2004/0205404 A1 Oct. 14, 2004

(51) Int. Cl.
*G06F 11/00* (2006.01)

(52) U.S. Cl. .................. 714/30; 714/726; 714/727

(58) Field of Classification Search ............ None
See application file for complete search history.

(56) References Cited

U.S. PATENT DOCUMENTS

| | | | |
|---|---|---|---|
| 4,821,174 A | | 4/1989 | Webb et al. |
| 5,155,732 A | * | 10/1992 | Jarwala et al. ............ 714/726 |
| 5,657,328 A | * | 8/1997 | Swoboda .................. 714/726 |
| 5,768,152 A | * | 6/1998 | Battaline et al. ........... 702/186 |
| 5,838,692 A | * | 11/1998 | Tobin ....................... 714/724 |
| 5,862,152 A | * | 1/1999 | Handly et al. ............ 714/727 |
| 6,041,406 A | * | 3/2000 | Mann ....................... 712/227 |
| 6,142,683 A | * | 11/2000 | Madduri ................... 717/128 |
| 6,427,217 B1 | * | 7/2002 | Hartnett ................... 714/733 |
| 6,640,324 B1 | * | 10/2003 | Goldovsky ................ 714/729 |
| 6,643,812 B1 | * | 11/2003 | Reasor ..................... 714/727 |
| 6,662,313 B1 | * | 12/2003 | Swanson et al. ............ 714/39 |
| 6,711,684 B1 | * | 3/2004 | Moroney et al. .......... 713/191 |
| 6,779,142 B1 | * | 8/2004 | Bhavsar et al. ........... 714/726 |
| 2004/0114524 A1 | * | 6/2004 | Depta et al. .............. 370/241 |
| 2005/0149800 A1 | * | 7/2005 | Jones et al. ............... 714/726 |

FOREIGN PATENT DOCUMENTS

| | | |
|---|---|---|
| EP | 0 727 747 A2 | 8/1996 |
| EP | 0 892 352 A1 | 1/1999 |
| GB | 2 324 943 A | 11/1998 |

OTHER PUBLICATIONS

Examination Report Under Section 18(3) from the UK Patent Office dated Jul. 29, 2005; 3 pages.
Search Report Under Section 17(5): Jul. 16, 2004; 3 pages.
Bart Vermeulen and Sandeep Kumar Goel, "Design for Debug: Catching Design Errors in Digital Chips", IEEE Design & Test of Computers; May-Jun. 2002; pp. 37-45.

* cited by examiner

*Primary Examiner*—Gabriel L. Chu

(57) ABSTRACT

An integrated circuit ("IC") comprising a plurality of logic modules. The IC further comprises a plurality of bus segments each associated with one of the logic modules; a debug bus interconnecting the bus segments in a ring; and a debug port connected to the debug bus for accessing debug data on the debug bus. Each bus segment takes in data from the logic module associated therewith and outputs the data to the debug bus to be forwarded to the next bus segment along the ring.

32 Claims, 2 Drawing Sheets

INTEGRATED CIRCUIT

CROSS-REFERENCE TO RELATED APPLICATIONS

This application is related to U.S. patent application Ser. No. 10/402,092, filed Mar. 28, 2003, entitled A BUS INTERFACE MODULE; U.S. patent application Ser. No. 10/402,628, filed Mar. 28, 2003, entitled SYSTEM AND METHOD FOR USING A DEBUG BUS AS A CAPTURE BUFFER; and U.S. patent application Ser. No. 10/402,122, filed Mar. 28, 2003, entitled SYSTEM AND METHOD FOR VERIFYING HDL EVENTS, all of which are hereby incorporated by reference in their entirety.

BACKGROUND

The increasing complexity of system designs, increased investment required due to this complexity, and shortened product cycles have presented significant challenges to post-silicon design verification of chipsets. This is especially true with respect to high-end cache coherent non-uniform memory access ("ccNUMA") chipsets where systems can be extremely large and complex. Processor post-silicon verification is typically focused on electrical verification at least as much as functional verification due to the large amount of full custom design. Chipsets present a different challenge due to the large number of cells of which they are comprised. Additionally, due to the sheer number of buses, internal bus arbitration, cache coherency control, queue arbitration, etc., in a large ccNUMA server, post-silicon functional verification of such a chipset consumes a greater amount of resources with respect to electrical verification than processors typically consume. Internal observability, while relatively simple in pre-silicon verification, poses a major obstacle to debug and functional test coverage.

Determining when system verification is complete is a second major obstacle to completing post-silicon verification in a time-effective manner. While pre-silicon simulation-based testing depends significantly on labor intensive directed and pseudo-random testing, post-silicon testing has historically depended on observing system operations that imply correct behavior.

Performing post-silicon design verification is an industry standard practice that facilitates exposure of bugs not typically uncovered in pre-silicon verification. Typical post-silicon bugs discovered include those that are manifested after long or at-speed operation of the system, those resulting due to incorrect modeling of hardware and firmware interfaces, those resulting from Register-Transfer Language ("RTL") errors that escaped pre-silicon detection, and those resulting from incorrect mapping of RTL-to-silicon (synthesis/physical bugs). Accepted methods of exercising systems to expose post-silicon bugs include running operating systems and software applications targeted for the final system, creating specific directed software tests that stress different portions of the system, and running software tests that create random system operations.

Real-time observability ("RTO") refers to the ability to monitor and capture internal signals in real time either on- or off-chip. While internal signal observability features have been available in some field programmable gate array ("FPGA") architectures and application specific integrated circuits ("ASICs"), they have typically been of limited scope. Limiting factors have been silicon area, wiring constraints, and I/O limitations. In addition, observability features have traditionally been used for debug and not functional test coverage.

SUMMARY

In one embodiment, the invention is directed to an integrated circuit ("IC") comprising a plurality of logic modules, the IC further comprising a plurality of bus segments each associated with one of the logic modules; a debug bus interconnecting the bus segments in a ring; and a debug port connected to the debug bus for accessing debug data on the debug bus, wherein each bus segment takes in data from the logic module associated therewith and outputs the data to the debug bus to be forwarded to the next bus segment along the ring.

DETAILED DESCRIPTION OF THE DRAWINGS

Figure 1:
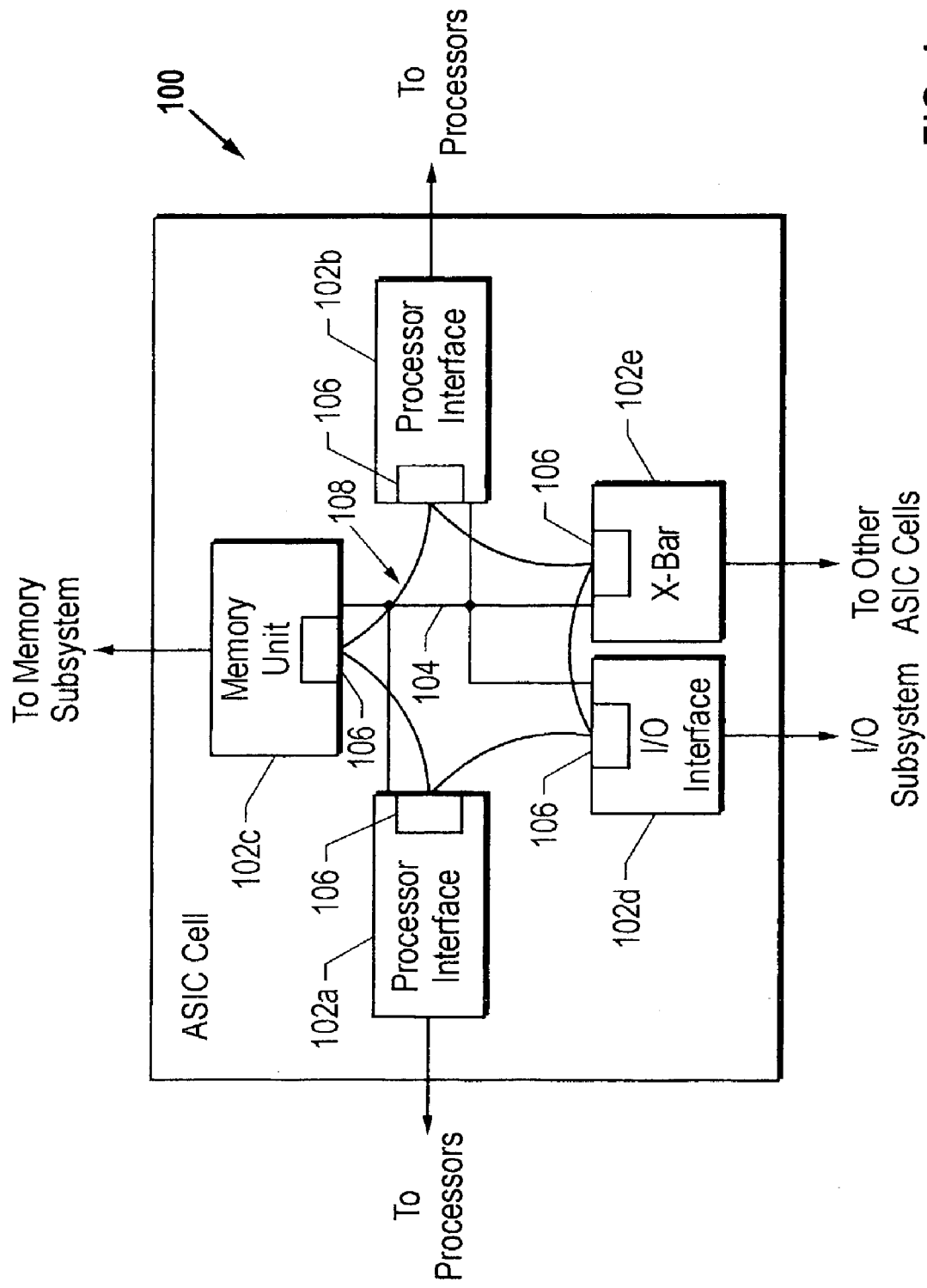
FIG. 1 is a functional block diagram of one embodiment.

In the drawings, like or similar elements are designated with identical reference numerals throughout the several views thereof, and the various elements depicted are not necessarily drawn to scale.

FIG. 1 is a functional block diagram of an embodiment of an ASIC cell 100 comprising a plurality of functional interfaces, represented in FIG. 1 by five functional interfaces 102a–102e, interconnected via one or more communications buses, collectively designated by reference numeral 104. In one implementation, the functional interfaces 102a–102e comprise two processor interfaces ("PIs"), a memory unit ("MU"), an I/O interface, and a cross-bar ("X-BAR"), respectively. Each interface 102a–102e functions to interface signals from a device connected thereto with a device connected to another one of the interfaces via the bus(es) 104. In particular, each PI 102a, 102b, provides an interface with one or more processors (not shown) connected thereto; the MU 102c provides an interface with a memory subsystem (not shown), which may be implemented as a Dual In-Line Memory Module ("DIMM"); the I/O interface 102d provides an interface with an I/O subsystem (not shown); and the X-Bar 102e provides an interface with another ASIC cell (not shown) like the cell 100.

In accordance with one embodiment, each of the functional interfaces 102a–102e includes a bus segment 106 operable as a debug bus interface module ("DBIM"). The bus segments 106 are interconnected to form an observability, or debug, bus 108. As will be described in greater detail with reference to FIG. 2, the debug bus 108 connects the bus segments or DBIMs 106 in a serial ring and runs at the core clock speed of the ASIC cell 100. In one embodiment, the debug bus 108 is 80-bits wide; however, in general, the width of the debug bus is consistent with device pin constraints. Moreover, although the illustrated embodiment employs only five bus segments 106, it will be appreciated that greater or fewer than five bus segments may be implemented as necessary for providing appropriate logical and physical partitioning.

Figure 2:
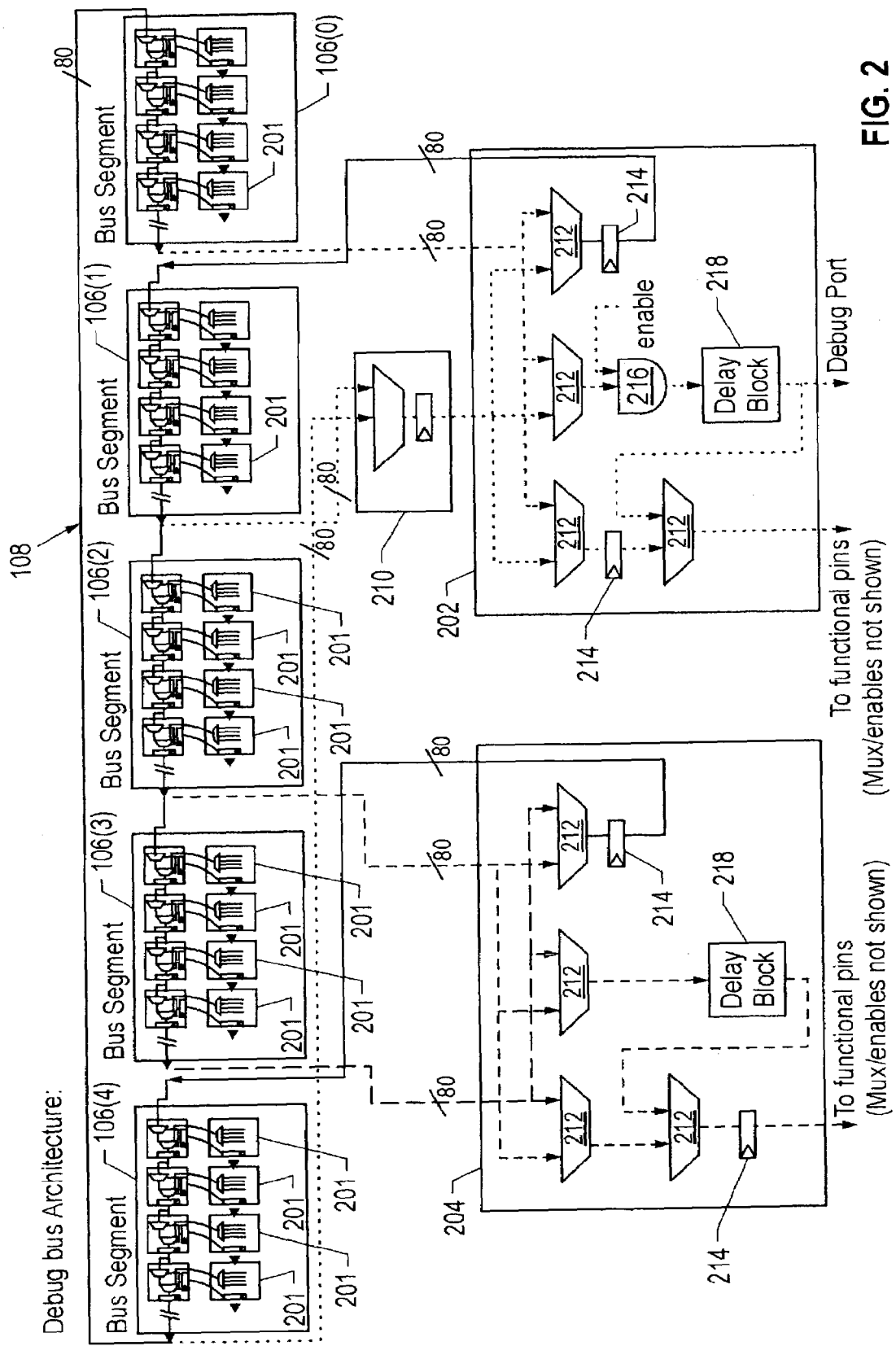
FIG. 2 is a more detailed block diagram of a debug bus of the embodiment illustrated in FIG. 1.

FIG. 2 is a more detailed functional block diagram of the debug bus 108 including the bus segments 106, which are individually distinguished in FIG. 2 by reference numerals 106(0)–106(4). Each bus segment 106(0)–106(4) comprises several access points, or debug bus interface blocks ("DBIB"), 201 at which data from surrounding logic is MUXed onto the debug bus 108. Each DBIB 201 comprises a standard logic block with a proprietary MUX structure that drives debug data into the DBIB, which subsequently drives the data onto the debug bus 108. Specific implementation and operational details of the DBIB 201 are provided in commonly-assigned, co-pending U.S. patent application Ser. No. 10/402,092, filed Mar. 28, 2003, entitled A BUS INTERFACE MODULE which has been incorporated by reference in its entirety hereinabove.

In one embodiment, the debug bus 108 has 29 access points, including 28 DBIBs 201, as well as a performance monitor (not shown) at which data (in particular, debug data) from surrounding logic can be MUXed onto the debug bus. The debug bus 108 is divided into eight 10-bit blocks. The DBIBs 201 can move and/or replicate data in these 10-bit blocks on the debug bus 108 to make room for incoming data, if necessary. Generally, each DBIB 201 performs the following three functions: (1) it passes data on from the previous DBIB, (2) it swaps 10-bit blocks of incoming data to other ranges of the debug bus, allowing for more efficient bandwidth utilization; and (3) it MUXes in debug data from surrounding logic in 10-bit chunks.

As illustrated in FIG. 2, two observability ports 202, 204, are defined. In one embodiment, one of the ports, i.e., port 202, is a dedicated debug port. The other port, i.e., port 204, is loaded with functional signals. The debug bus 108 contains debug data that drives both of these ports 202, 204. In one embodiment, the debug port 202 has 80 data pins, plus four strobe pins that are single pumped, with the intention that the port 202 be connected directly to a logic analyzer (not shown). As previously indicated, the debug port 202 is fed directly from the debug bus 108, which runs at core clock speed and connects the bus segments 106 in a serial ring. The debug bus 108 is segmented so that for any of the functional interfaces 102a–102e of the ASIC cell 100, packets to and from the interface can be observed in addition to 80 bits of internal state data.

In order to simplify the process of configuring the debug bus 108, a software tool referred to herein as the Debug Bus Usage Script ("DBUS") has been developed. DBUS is a menu-driven script that enables a user to configure the debug bus 108 without any knowledge of the underlying hardware. DBUS enables users to select internal signals on a prioritized basis until the observability port 202 is completely configured. Then, upon outputting the commands necessary to configure the ports 202, 204, DBUS outputs a logic analyzer configuration file. DBUS features include support for automated configuration for data from up to eight different areas within the ASIC cell 100, an interface to a scan tool to directly configure the debug hardware, automated delay equalization for signals with different relative latencies, a logic analyzer interface via the debug port 202, and an interface to the performance monitor (not shown) for performance data acquisition.

As previously indicated, to make MUXing of data manageable, the debug bus 108 is logically divided into eight 10-bit blocks, each of which can be handled separately. As previously indicated, each DBIB 201 registers the previous DBIB's output, shifts the previous DBIB's data to other 10-bit blocks to make room for incoming data as needed, and MUXes its own data to be passed on to the next DBIB.

As illustrated in FIG. 2, in one embodiment, the debug port 202 is connected to the end of bus segment 106(0) and the port 204 is connected to the end of bus segment 106(2).

The debug bus 108 can be configured (using DBUS) such that the ends of bus segments 106(1) or 106(4) are routed directly to the debug port 202 via a Memory unit Header Generator (MHG) element 210, bypassing the rest of the debug bus. Similarly, the debug bus 108 can be configured such that the end of bus segment 106(3) are routed directly to the port 204, bypassing the rest of the debug bus.

Each of the ports 202, 204 includes a plurality of MUXes 212, clocked registers 214 and gates 216, which are configured to provide observability with respect to selected internal signals as described above with reference to the DBUS. In particular, the MUXes select different segments 106(0)–106(4) of the debug bus 108 to be output from the port. Additionally, each port 202, 204, includes a delay block 218, which can independently delay each 10-bit block of data on the debug bus 108 by some number of cycles. These delay blocks 218 enable data from different parts of the cell 100 and with different relative latencies to be lined up for ease of use by a logic analyzer, if necessary. All of the MUXes 212 are controlled by control status registers ("CSRs").

In general, the embodiment described herein defines a topology for a debug bus 108 that allows data from different bus segments 106(0)–106(4) to be routed to each of the observability ports 202, 204, effectively making the observation bandwidth twice the bandwidth of the debug bus 108, while optimizing the usefulness of the available content. The topology is defined as a data bus that drives data in a ring from the end of the bus back to the beginning with a plurality of additional segments driving from various parts of the ring to the observability ports. In this manner, the embodiment utilizes on-chip resources to enable post-silicon real-time internal observability.

An implementation of the invention described herein thus provides an architecture topology for enabling real-time observability in an IC. The embodiments shown and described have been characterized as being illustrative only; it should therefore be readily understood that various changes and modifications could be made therein without departing from the scope of the present invention as set forth in the following claims. For example, while the embodiments are described with reference to an ASIC, it will be appreciated that the embodiments may be implemented in other types of ICs, such as custom chipsets, Field Programmable Gate Arrays ("FPGAs"), programmable logic devices ("PLDs"), generic array logic ("GAL") modules, and the like. Furthermore, while the embodiments shown are implemented using CSRs, it will be appreciated that control signals may also be applied in a variety of other manners, including, for example, directly or may be applied via scan registers or Model Specific Registers ("MSRs").

Accordingly, all such modifications, extensions, variations, amendments, additions, deletions, combinations, and the like are deemed to be within the ambit of the present invention whose scope is defined solely by the claims set forth hereinbelow.

What is claimed is:

1. An integrated circuit ("IC") comprising a plurality of logic modules, the IC further comprising:
   a plurality of interface modules each associated with one of the logic modules;
   a debug bus interconnecting the interface modules in a ring; and
   a debug port connected to the debug bus for accessing debug data on the debug bus,
   wherein each interface module is adapted to take in data from the logic module associated therewith and rearrange it with data transmitted from a previous logic module in a chunk-by-chunk controllable manner, the rearranged data to be output to the debug bus to be forwarded to the next interface module along the ring, further wherein the debug bus comprises a plurality of bits in width that is segmented into a number of blocks, each block comprising a sub-plurality of bits.

2. The IC of claim 1 wherein data traverses the ring in only one direction.

3. The IC of claim 1 further comprising a second port for accessing debug data from the debug bus.

4. The IC of claim 3 wherein an output of any one of the interface modules is connectable to one of the ports.

5. The IC of claim 1 wherein each of the blocks is individually manipulatable.

6. The IC of claim 1 wherein the debug bus is 80 bits wide.

7. The IC of claim 1 wherein the data on the debug bus is segmented into eight 10-bit blocks.

8. The IC of claim 1 wherein at least one interface module of the plurality of interface modules is associated with a memory unit interface.

9. The IC of claim 1 wherein at least one interface module of the plurality of interface modules is associated with a processor interface.

10. The IC of claim 1 wherein at least one interface module of the plurality of interface modules is associated with an input/output (I/O) interface.

11. The IC of claim 1 wherein at least one interface module of the plurality of interface modules is associated with a cross-bar interface.

12. An integrated circuit ("IC") comprising:
a debug bus configured as a ring, wherein data traverses the debug bus in only one direction;
a plurality of debug bus interface modules ("DBIM") connected to the debug bus; and
an observability port connected to the debug bus for accessing data on the debug bus,
wherein each DBIM is adapted to take in data from local logic associated therewith and rearrange it with data transmitted from a previous DBIM in a chunk-by-chunk controllable manner the rearranged data to be output to the debug bus to be forwarded to the next DBIM along the ring, further wherein the debug bus comprises a plurality of bits in width that is segmented into a number of blocks, each block comprising a sub-plurality of bits.

13. The IC of claim 12 wherein each of the blocks is individually manipulatable.

14. The IC of claim 12 wherein the debug bus is 80 bits wide.

15. The IC of claim 12 wherein the data on the debug bus is segmented into eight 10-bit blocks.

16. The IC of claim 12 further comprising a second observability port for accessing debug data from the debug bus.

17. The IC of claim 12 wherein an output of any one of the DBIMs is connectable to one of the observability ports.

18. The IC of claim 12 wherein at least one DBIM of the plurality of DBIMs is associated with a memory unit interface.

19. The IC of claim 12 wherein at least one DBIM of the plurality of DBIMs is associated with a processor interface.

20. The IC of claim 12 wherein at least one DBIM of the plurality of DBIMs is associated with an input/output (I/O) interface.

21. The IC of claim 12 wherein at least one DBIM of the plurality of DBIMs is associated with a cross-bar interface.

22. A method of implementing a debug bus in an integrated circuit ("IC") comprising a plurality of logic modules each associated with one of a plurality of debug bus interface modules ("DBIMs"), wherein the DBIMs are interconnected in a ring via the debug bus, the method comprising:
one of the DBIMs interfacing data from the logic module associated therewith to the debug bus; and
forwarding the data to the next DBIM along the debug bus, the next DBIM operating to rearrange the data received on the debug bus with local data from the logic module associated therewith, the rearrangement being effectuated in a chunk-by-chunk controllable manner, wherein the debug bus comprises a plurality of bits in width that is segmented into a number of blocks, each block comprising a sub-plurality of bits.

23. The method of claim 22 further comprising accessing the data on the debug bus via an observability port.

24. The method of claim 22 further comprising connecting one of the DBIMs to a debug port of the debug bus thereby to access data output from the DBIM and bypass the remainder of the DBIMs.

25. The method of claim 22 wherein each of the blocks is individually manipulatable.

26. The method of claim 22 wherein the rearrangement comprises performing at least one of passing data from the previous DBIM to the next DBIM, moving blocks of data from the previous DBIM from one range of the debug bus to another, and interfacing at least one block of data from the associated logic module onto a specified range of the debug bus.

27. The method of claim 22 wherein the debug bus is 80 bits wide.

28. The method of claim 22 wherein the data on the debug bus is segmented into eight 10-bit blocks.

29. The method of claim 22 wherein at least one of the DBIMs operates to interface data from a memory unit interface to the debug bus.

30. The method of claim 22 wherein at least one of the DBIMs operates to interface data from a processor interface to the debug bus.

31. The method of claim 22 wherein at least one of the DBIMs operates to interface data from an input/output (I/O) interface to the debug bus.

32. The method of claim 22 wherein at least one of the DBIMs operates to interface data from a cross-bar interface to the debug bus.

* * * * *

UNITED STATES PATENT AND TRADEMARK OFFICE
CERTIFICATE OF CORRECTION

PATENT NO. : 7,188,277 B2 Page 1 of 1
APPLICATION NO. : 10/402034
DATED : March 6, 2007
INVENTOR(S) : Tyler James Johnson It is certified that error appears in the above-identified patent and that said Letters Patent is hereby corrected as shown below:

In column 5, line 41, in Claim 12, after "manner" insert -- , --.

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

PATENT NO.          : 7,188,277 B2                                    Page 1 of 1
APPLICATION NO. : 10/402034
DATED                 : March 6, 2007
INVENTOR(S)       : Tyler James Johnson It is certified that error appears in the above-identified patent and that said Letters Patent is hereby corrected as shown below:

In column 5, line 41, in Claim 12, after "manner" insert -- , --.

Signed and Sealed this

Twenty-fifth Day of November, 2008

JON W. DUDAS
*Director of the United States Patent and Trademark Office*